United States Patent [19]

Wiesner

[11] 4,117,421
[45] Sep. 26, 1978

[54] CRYSTAL OSCILLATOR WITH REDUCED POWER CONSUMPTION

[75] Inventor: Leo Wiesner, Kew Gardens, N.Y.

[73] Assignee: Timex Corporation, Waterbury, Conn.

[21] Appl. No.: 820,478

[22] Filed: Jul. 29, 1977

[51] Int. Cl.² ............................................. H03B 5/36
[52] U.S. Cl. ........................... 331/116 R; 58/23 AC; 331/185
[58] Field of Search ........... 331/108 C, 108 D, 116 R, 331/185; 58/23 R, 23 AC, 23 A

[56] References Cited

U.S. PATENT DOCUMENTS 4,016,508  4/1977  Kobori ........................... 331/116 R Primary Examiner—John Kominski
Attorney, Agent, or Firm—Lawrence Hager

[57] ABSTRACT

A crystal-controlled oscillator having a switching transistor connected in series with the crystal tank circuit and amplifier of the oscillator.

Power consumption is reduced by minimizing the tank circuit capacitance being charged and discharged by the amplifier. The tank circuit capacitance is reintroduced into or coupled to the amplifier circuit during a submultiple oscillation period to receive regenerative feedback from said amplifier circuit to thereby replenish the tank circuit energy losses.

3 Claims, 2 Drawing Figures

CRYSTAL OSCILLATOR WITH REDUCED POWER CONSUMPTION

BACKGROUND OF THE INVENTION

This invention relates generally to an improved piezoelectric crystal oscillator circuit. It is particularly directed to the provision of a crystal oscillator for use in an electronic timepiece which has reduced power consumption.

Recently, wristwatches have been developed which utilize quartz crystal-controlled oscillators to provide a high frequency time standard signal.

In such timepieces, however, the self-contained power supply is of limited capacity. Therefore, it is advantageous to design the oscillator circuit such that its power consumption is minimal.

Some known embodiments of crystal-controlled oscillators utilized in wristwatches comprise a colpitts oscillator circuit with a crystal vibrator/resonator connected across the output and intput terminals of a phase inverting amplifier, and two condensers each connected between said output and input terminals and earth or a reference terminal. As seen from the prior art, however, the operation of this kind of crystal oscillator circuit gives rise in particular to such oscillation conditions which result in inefficient oscillator operation.

The prior art includes a number of crystal oscillator circuits such as is described in U.S. Pat. No. 3,855,549 issued Dec. 17; 1974 to Huener et al; U.S. Pat. No. 3,946,257 issued Mar. 23, 1976 to Yasukazu Kawamura; U.S. Pat. No. 3,935,546 issued Jan. 27, 1976 to Shimosuwa et al and U.S. Pat. No. 3,560,998 issued Feb. 2, 1971 to Walton.

SUMMARY OF THE INVENTION

Generally speaking, in accordance with the invention, a piezoelectric crystal oscillator circuit is provided wherein the capacitance load on the amplifier is periodically reduced to thereby minimize (wasted) energy drain from the amplifier.

It is an object of the present invention, therefore, to provide a highly efficient oscillator.

It is another object of the present invention to provide a crystal oscillator circuit which requires less input current/power to sustain power actuation of the counting/divider circuits.

It is a further object of the present invention to provide a more efficient crystal oscillator for use in timepieces operated from a small battery power supply.

Further advantages and objectives of the present invention will be apparent from the following detailed description of the preferred embodiments of the invention. Like reference numerals refer to like devices/functions throughout.

DETAILED DESCRIPTION OF THE INVENTION

The following is a detailed description of the best presently contemplated mode of carrying out the invention. This description is not to be taken in a limiting sense but is made merely for the purpose of illustrating the general principles of the invention since the scope of the invention is best defined by the appended claims.

Figure 1:
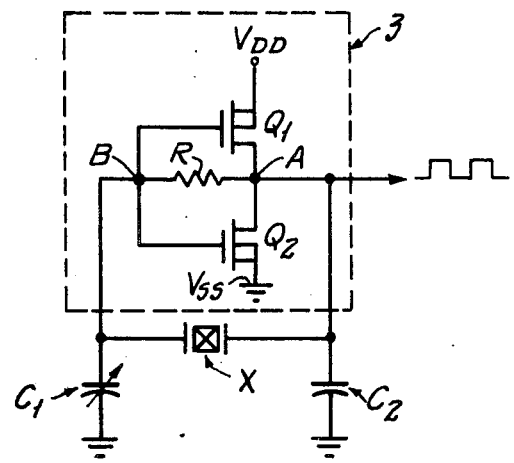
FIG. 1 is a circuit diagram of a quartz crystal oscillator circuit constructed in accordance with the prior art.

Referring now to FIG. 1, wherein a prior art quartz crystal-controlled oscillator circuit is shown comprising a quartz crystal X, two capacitors $C_1$, $C_2$ and an amplifier shown within phantom outline 3 which includes two complementary coupled field effect transistors $Q_1$, $Q_2$ connected at the drain terminals thereof to define an output terminal A and a feedback resistor R connected between output terminal A and an input terminal B defined by the connected gate terminals of transistors $Q_1$ and $Q_2$. The output terminal A and the input terminal B are connected to output capacitor $C_2$ and input capacitor $C_1$, respectively, the other terminals of $C_1$ and $C_2$ being grounded. The conduction paths of the two transistors $Q_1$, $Q_2$ are connected in series between two operating voltage terminals $V_{DD}$ and $V_{SS}$, where $V_{DD}$ may be a positive voltage terminal and $V_{SS}$ ground.

In the operation of the circuit of FIG. 1, the circuit swings between output voltage levels $V_{DD}$ and $V_{SS}$. During each cycle, current flows to charge and discharge capacitor $C_2$ and/or $C_1$. By the coupling of the output terminal A to the input terminal B through the Quartz crystal X, the circuit is rendered self-oscillatory, to thereby set an operating point thereof.

The power or current consumed during each cycle of operation, neglecting the also wasted current/energy which flows through both devices $Q_1$ and $Q_2$ when changing their conducting state, is that flowing from transistors $Q_1$ and $Q_2$, acting as a source of current and as a current sink, into output capacitor $C_2$ and/or $C_1$. This flow of (load capacitance charge and discharge) current during each cycle is wasted power.

Figure 2:
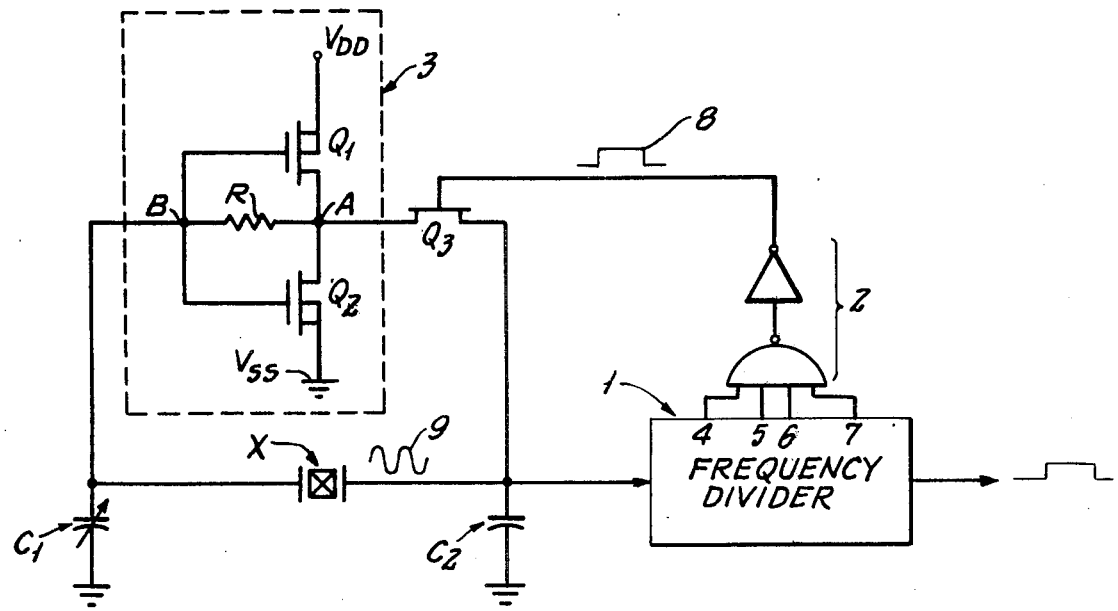
FIG. 2 is a circuit diagram of a preferred embodiment of the invention.

The power dissipation of the circuit of FIG. 1 can be decreased by minimizing or in effect substantially reducing the capacitance load, i.e. the capacitance of capacitor $C_2$ and/or $C_1$, on the amplifier which is charged and discharged during each oscillation cycle in the manner shown in FIG. 2.

In FIG. 2, a switching transistor $Q_3$ is connected in series between output terminal A and a frequency divider 1 in such a manner that the oscillatory signal 9 of the tank circuit, formed by the capacitors $C_1$, $C_2$ and quartz crystal X operated in its inductive mode can be applied to the input of the frequency divider 1 with the amplifier shown within phantom outline 3 disconnected from the tank circuit X, $C_1$, $C_2$. By proper gating of the outputs, 4, 5, 6 and 7 of the frequency divider 1 as illustrated by the logic gate circuit 2, a control signal/pulse 8 equal in width to one cycle of the oscillator frequency, and occurring at a sub-multiple of that frequency is generated. This control signal/pulse 8 is applied to the normally nonconducting i.e. open, switching transistor $Q_3$ and closes the switch, i.e. causes switching transistor $Q_3$ to be conductive, which thereby permits an output current pulse from the amplifier to flow through switching transistor $Q_3$ to supply regenerative energy to the tank circuit X, $C_1$, $C_2$. The tank circuit X, $C_1$, $C_2$ is thereby recharged with respect to energy losses which occurred from tank circuit oscillations and actuation of the frequency divider 1, during the time when the tank circuit is disconnected from the amplifier, i.e. when switching transistor $Q_3$ is open or nonconducting. Thus the capacitance load on output terminal A is removed or substantially reduced, e.g. to the stray or parasitic capacitance of the circuit, during a desired number of tank circuit X, $C_1$, $C_2$ or oscillator circuit oscillations. During this period, the divider circuit 1 is triggered or actuated from or by the tank circuit oscillation signal 9. Therefore, the periods between which the amplifier is disconnected from the tank circuit, in particular output capacitor $C_2$, should not be too long such that energy losses in the tank circuit reduce the tank circuit oscillation signal 9 beyond which it cannot sustain proper actuation of the divider circuit 1.

Thus, in accordance with the preferred embodiment of the invention, switching transistor $Q_3$ is controlled by a control signal/pulse 8 to remove, disconnect or substantially minimize the oscillator tank circuit capacitance load on the amplifier for $n-1$ cycles out of $n$ cycles of oscillations of the oscillator (where $n > 1$).

While there has been described herein what is considered to be the preferred embodiment of the invention, other modifications may occur to those skilled in the art, and it is intended that the appended claims are to cover all such modifications which fall within the true spirit and scope of the invention.

What is claimed is:

1. In combination:

an oscillator means for providing an output signal comprising a tank circuit having a piezoelectric crystal vibrator connected across two series capacitances with a grounded connection between the two capacitances, and an inverting amplifier having an input and output terminal connected to said tank circuit to provide a regenerative feedback signal thereto;

switch means coupled in series between said tank circuit and the output terminal of said inverting amplifier for periodically disconnecting said tank circuit from the output terminal of said inverting amplifier.

2. The combination as set forth in claim 1, wherein:

said switch means comprises a transistor in series between said output terminal and the tank circuit, said transistor being responsive to a signal for selectively opening the series connection between said output terminal and said tank circuit to thereby reduce the capacitance load on said inverting amplifier at its output terminal.

3. In combination:

an oscillator means for providing a predetermined output signal comprising a tank circuit having a quartz crystal resonator connected across a first and second series connected capacitance with a grounded connection between the two capacitances, said quartz crystal resonator being coupled across an inverter circuit having an N-channel and a P-channel MOS field effect transistor coupled at the drain terminals thereof to define an output terminal, said output terminal being coupled through a resistive means to an input terminal of the inverter circuit defined by a connection of the gate terminals of said transistors;

circuit means responsive to said predetermined output signal for providing a control signal having a frequency lower than said predetermined output signal;

switch means connected between said inverter circuit and said first capacitance being responsive to said control signal for periodically opening and closing a circuit connection between said first capacitor and said inverter circuit.

* * * * *